United States Patent
Sekiya et al.

(10) Patent No.: US 12,119,230 B2
(45) Date of Patent: Oct. 15, 2024

(54) WET ETCHING METHOD AND WET ETCHING SYSTEM

(71) Applicant: DISCO CORPORATION, Tokyo (JP)

(72) Inventors: Kazuma Sekiya, Tokyo (JP); Takashi Ono, Tokyo (JP); Daigo Shitabo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 363 days.

(21) Appl. No.: 17/220,990

(22) Filed: Apr. 2, 2021

(65) Prior Publication Data

US 2021/0335620 A1    Oct. 28, 2021

(30) Foreign Application Priority Data

Apr. 28, 2020   (JP) ................ 2020-078903

(51) Int. Cl.
*H01L 21/306* (2006.01)
*H01L 21/67* (2006.01)

(52) U.S. Cl.
CPC .... *H01L 21/30604* (2013.01); *H01L 21/6708* (2013.01)

(58) Field of Classification Search
None
See application file for complete search history.

(56) References Cited

U.S. PATENT DOCUMENTS

| | | | | |
|---|---|---|---|---|
| 5,876,271 A * | 3/1999 | Oliver | ................ | B24B 37/105 451/60 |
| 6,168,684 B1 * | 1/2001 | Mitsuhashi | ............ | B24B 47/10 451/287 |
| 2007/0032174 A1 * | 2/2007 | Nagai | ................ | B24B 37/16 451/41 |
| 2008/0318495 A1 * | 12/2008 | O'Moore | ............. | B24B 37/26 451/41 |
| 2011/0048542 A1 * | 3/2011 | Weinstock | ............ | B24B 57/00 137/551 |
| 2012/0103521 A1 * | 5/2012 | Cheng | ................ | C23F 1/08 156/345.18 |

(Continued)

FOREIGN PATENT DOCUMENTS

| JP | 08153656 A | | 6/1996 | |
|---|---|---|---|---|
| JP | 11070459 A | * | 3/1999 | .......... B24B 53/017 |
| JP | 2001070861 A | | 3/2001 | |

(Continued)

OTHER PUBLICATIONS

Machine Translation of JP 2012064968 (Year: 2024).*

(Continued)

*Primary Examiner* — Allan W. Olsen
(74) *Attorney, Agent, or Firm* — Greer, Burns & Crain, Ltd.

(57) ABSTRACT

There is provided a wet etching method including an etchant supply step of supplying an etchant from an etchant supply nozzle to a to-be-etched surface of a workpiece, an etching step of etching the to-be-etched surface with the etchant remaining on the to-be-etched surface, and an etchant removal step of, after performing the etching step, removing the etchant, which still remains on the resulting etched surface, from the etched surface. The etchant supply step, the etching step, and the etchant removal step are repeated a plurality of times in this order.

4 Claims, 13 Drawing Sheets

(56) References Cited

U.S. PATENT DOCUMENTS

2015/0340250 A1* 11/2015 Lee .................... H01L 21/6708
                                                                                             156/345.18
2019/0145950 A1* 5/2019 Takulapalli ...... G01N 27/44791
                                                                                              204/452

FOREIGN PATENT DOCUMENTS

| JP | 2011134913 | A | * | 7/2011 | | |
| JP | 2012064968 | A | * | 3/2012 | | |
| JP | 2015153989 | A | | 8/2015 | | |
| JP | 2017168633 | A | | 9/2017 | | |
| JP | 2020131309 | A | * | 8/2020 | ............. | B24B 37/08 |

OTHER PUBLICATIONS

Machine Translation of JP 2020131309 (Year: 2024).*
Machine translation of JP 2011134913 (Year: 2024).*
Japanese Patent Application No. 2020-078903: English translation of Notice of Reasons for Refusal, Jun. 30, 2023 (4 pages).

* cited by examiner

WET ETCHING METHOD AND WET ETCHING SYSTEM

BACKGROUND OF THE INVENTION

Field of the Invention

The present invention relates to a wet etching method and a wet etching system, which are suitable for a fabrication step of semiconductor devices.

Description of the Related Art

In a fabrication step of semiconductor devices, wet etching is applied to wafers for circuit formation and rinsing. In JP 2017-168633A, for example, wet etching including immersing a wafer in an etchant is disclosed. In JP 2015-153989A, what is generally called spin etching is disclosed, in which etching is performed by supplying an etchant from a nozzle to a wafer held on a spinner table.

SUMMARY OF THE INVENTION

In immersion etching such as that disclosed in JP 2017-168633A, no replacement of an etchant is carried out, so that a long etching time is required even if the etchant is stirred in an etching bath. There is accordingly an outstanding earnest desire for a reduction in etching time.

In spin etching such as that disclosed in JP 2015-153989A, on the other hand, an etchant supplied is mostly discharged without contribution to etching. There is hence an outstanding keen desire for a saving in the amount of an etchant to be used.

The present invention therefore has as objects thereof the provision of a novel wet etching method and wet etching system, which enable a reduction in etching time and a saving in the amount of an etchant to be used.

In accordance with a first aspect of the present invention, there is provided a wet etching method including an etchant supply step of supplying an etchant from an etchant supply nozzle to a to-be-etched surface of a workpiece, an etching step of etching the to-be-etched surface with the etchant remaining on the to-be-etched surface, and an etchant removal step of, after performing the etching step, removing the etchant, the etchant still remaining on the resulting etched surface, from the etched surface. The etchant supply step, the etching step, and the etchant removal step are repeated a plurality of times in this order.

Preferably, the wet etching method further includes, after performing the etchant supply step, a pressing step of pressing the etchant, the etchant having been supplied to the to-be-etched surface of the workpiece, by a pressing member that includes a pressing surface having an area equal to or greater than an area of the to-be-etched surface of the workpiece and etching resistance. In the etching step, the to-be-etched surface is etched with the etchant remaining between the pressing surface of the pressing member and the to-be-etched surface of the workpiece.

In accordance with a second aspect of the present invention, there is provided a wet etching system including a holding subsystem that holds a workpiece with a to-be-etched surface of the workpiece exposed, an etchant supply subsystem that supplies an etchant to the to-be-etched surface of the workpiece held by the holding subsystem, an etchant removal subsystem that removes the etchant from the resulting etched surface of the workpiece, and a controller that controls the etchant supply subsystem and the etchant removal subsystem. The controller is configured to control the etchant supply subsystem and the etchant removal subsystem so that, after the etchant is supplied from the etchant supply subsystem to the to-be-etched surface of the workpiece held on the holding subsystem, the to-be-etched surface is etched with the etchant remaining on the to-be-etched surface, the etchant on the etched surface is then removed from the etched surface by the etchant removal subsystem, and the supply of the etchant, the etching of the to-be-etched surface, and the removal of the etchant from the etched surface are repeated a plurality of times in this order.

Preferably, the etchant supply subsystem includes a pressing member including a pressing surface that has an area equal to or greater than an area of the to-be-etched surface of the workpiece and etching resistance, and the controller is configured to control so that the etchant is pressed by the pressing member, the etchant having been supplied to the to-be-etched surface of the workpiece.

According to the wet etching method of the first aspect of the present invention and the wet etching system of the second aspect of the present invention, etching can be performed with the etchant remaining on the to-be-etched surface, so that the amount of the etchant to be used can be reduced compared with the existing wet etching. Further, after the removal of the etchant, which has reacted with the workpiece, from the surface of the workpiece under etching, etching is performed with an unused fresh supply of the etchant, thereby enabling to ensure a high etch rate (in other words, etch speed; volume of the workpiece etched per unit time) and also to reduce etching time.

Further, the use of the above-mentioned pressing member can supply the etchant over the entirety of the to-be-etched surface in a short time, for example, even if the workpiece has a large diameter and the to-be-etched surface has a large area, thereby enabling to reduce the etching time.

According to the wet etching system of the second aspect of the present invention, etching can be repeated a plurality of times, under automatic control by the controller.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

With reference to the attached drawings, a description will hereinafter be made regarding embodiments of the present invention.

First Embodiment

Figure 1:
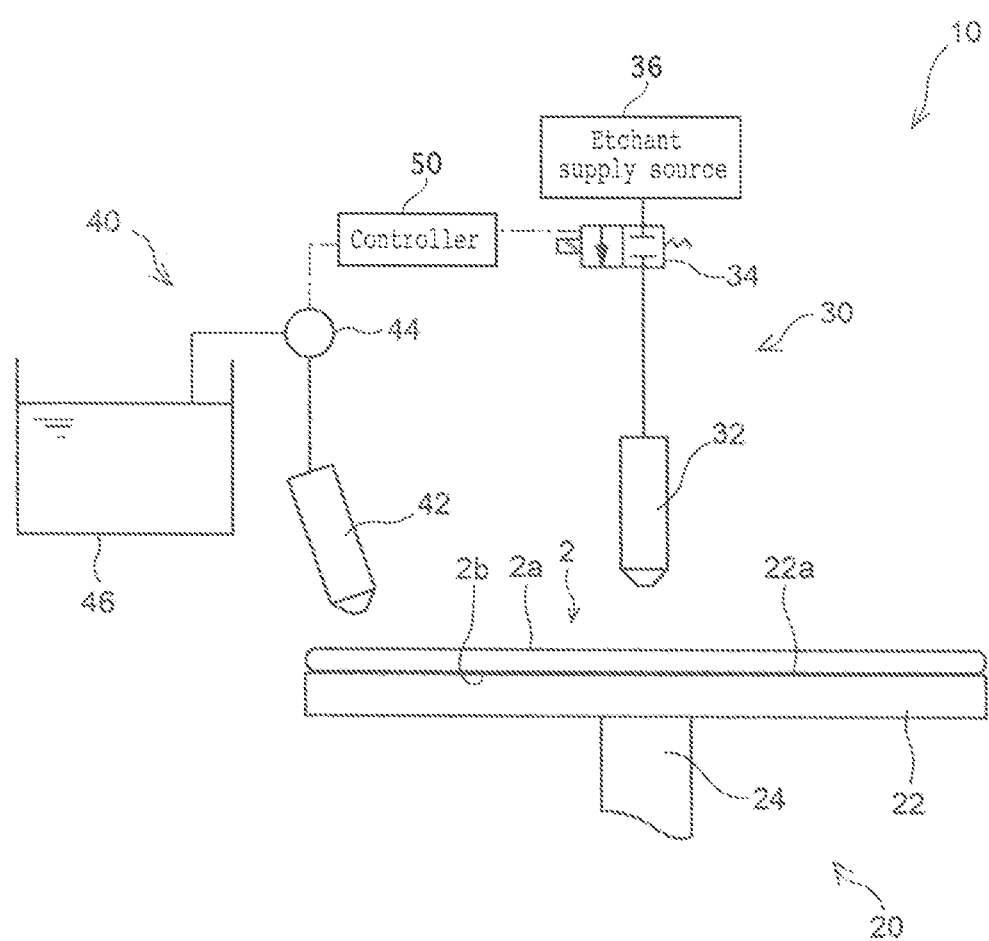
FIG. 1 is a diagram illustrating a first configuration example of a wet etching system.

FIG. 1 is a diagram illustrating a first configuration example of a wet etching system. With reference to FIG. 1, a description will be made regarding a wet etching system 10 according to the first configuration example. The configurations of individual constituents are merely illustrative and are not intended to specifically limit the scope of the present invention, and equivalent constituents and configurations can be adopted.

The wet etching system 10 includes a holding subsystem 20 that holds a workpiece 2 such as a silicon wafer, an etchant supply subsystem 30 that supplies an etchant 4 (see FIGS. 2 to 4) to a to-be-etched surface 2a of the workpiece 2, an etchant removal subsystem 40 that removes the etchant 4 from the resulting etched surface 2a, and a controller 50 that is configured to control these subsystems 30 and 40.

The workpiece 2 is, for example, a silicon wafer, and will be subjected to patterning by etching, followed by rinsing. On the to-be-etched surface 2a of the workpiece 2, a thin film of, for example, aluminum is masked with a resist, and aluminum is chemically corroded with the etchant 4.

The holding subsystem 20 includes a holding table 22 having a holding surface 22a that holds a to-be-held surface 2b as a lower side of the workpiece 2, and a support base 24 that supports the holding table 22.

The holding table 22 has an upper surface that functions as the holding surface 22a and is configured, for example, to hold the workpiece 2 under suction by a negative pressure or to hold the workpiece 2 by unillustrated clamps. However, the holding table 22 should not be limited to such a specific configuration. As a matter of fact, the holding table 22 may be in a form other than a table insofar as it is configured to enable holding the workpiece 2, and may have, for example, such a form that the workpiece 2 is held at only an outer peripheral edge thereof.

The support base 24 is configured to support the holding table 22 at an upper end portion of the support base 24 and to rotate, for example, by an unillustrated rotating mechanism. As an alternative, the support base 24 may be fixed without rotation. However, the support base 24 should not be limited to any specific configuration.

The etchant supply subsystem 30 includes an etchant supply nozzle 32 that supplies the etchant 4 to the to-be-etched surface 2a of the workpiece 2, an etchant supply valve 34, and an etchant supply source 36 that is connected to the etchant supply nozzle 32 via the etchant supply valve 34.

The etchant supply nozzle 32 may be configured to be of a fixed type in which its position is immobile, or, as an alternative, may be configured to move by an unillustrated moving mechanism. However, the etchant supply nozzle 32 should not be limited to any specific configuration.

The etchant supply valve 34 is connected to the controller 50. The controller 50 performs on/off control of the etchant supply valve 34, thereby controlling the start/stop of supply of the etchant 4 from the etchant supply nozzle 32.

If the material to be etched is aluminum, for example, a mixed solution of phosphoric acid, nitric acid, acetic acid, and water is used as the etchant 4. If etching is applied for the purpose to rinse the silicon wafer as the workpiece 2, a mixed solution consisting of one of sulfuric acid, hydrochloric acid, or ammonia solution and hydrogen peroxide solution, or the like is used as the etchant 4, for example.

The etchant removal subsystem 40 includes an etchant suction nozzle 42 that sucks and removes the etchant 4 remaining on the resulting etched surface 2a of the workpiece 2, a pump 44 that produces a suction force in the etchant suction nozzle 42, and a collection tank 46 that collects the etchant 4 sucked through the etchant suction nozzle 42.

The pump 44 is connected to the controller 50. The controller 50 controls the drive of the pump 44, thereby controlling the start/stop of suction of the etchant 4 through the etchant suction nozzle 42.

The etchant suction nozzle 42 may be configured to be of a fixed type in which its position is immobile, or, as an alternative, may be configured to move by an unillustrated moving mechanism. However, the etchant suction nozzle 42 should not be limited to any specific configuration.

Figure 2:
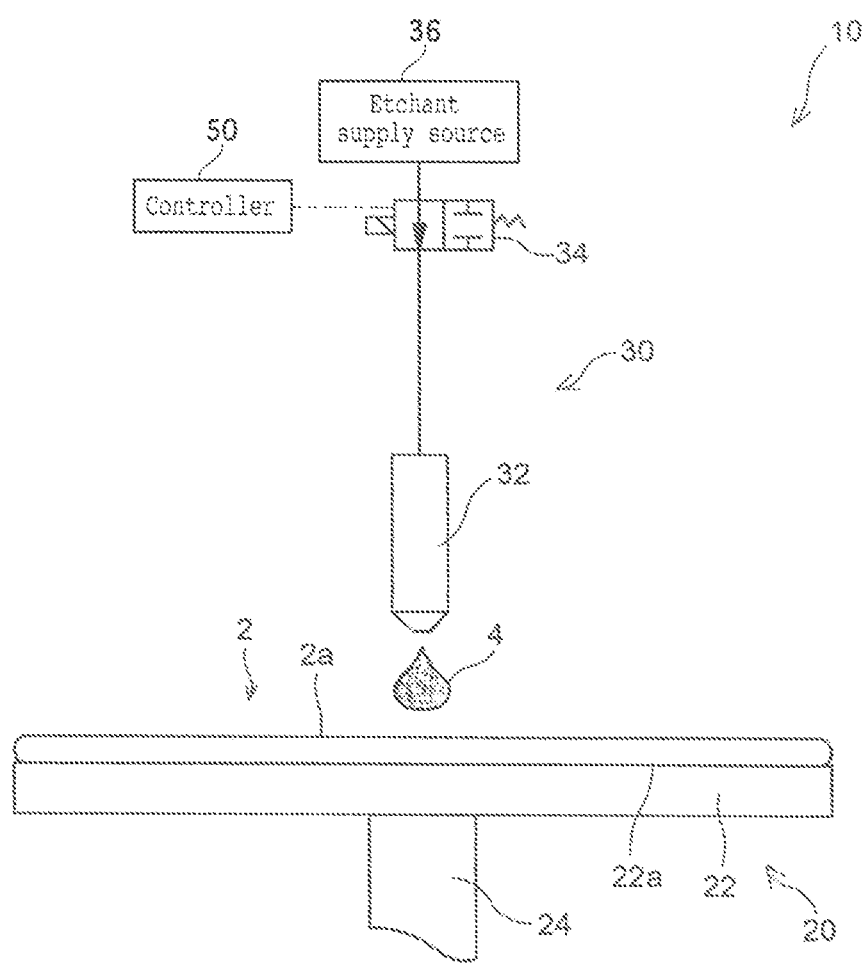
FIG. 2 is a diagram illustrating an etchant supply step in a wet etching method of a first embodiment performed by the first configuration example of FIG. 1.
Figure 3:
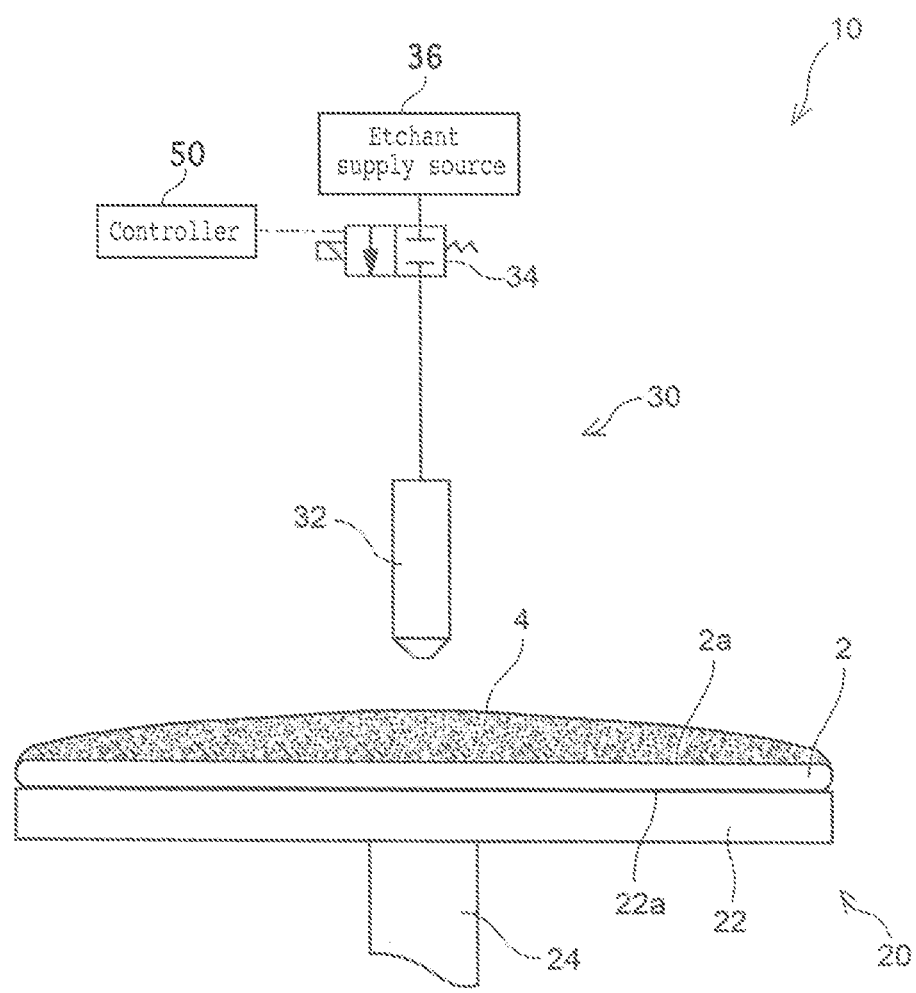
FIG. 3 is a diagram illustrating an etching step in the wet etching method of the first embodiment performed by the first configuration example of FIG. 1.
Figure 4:
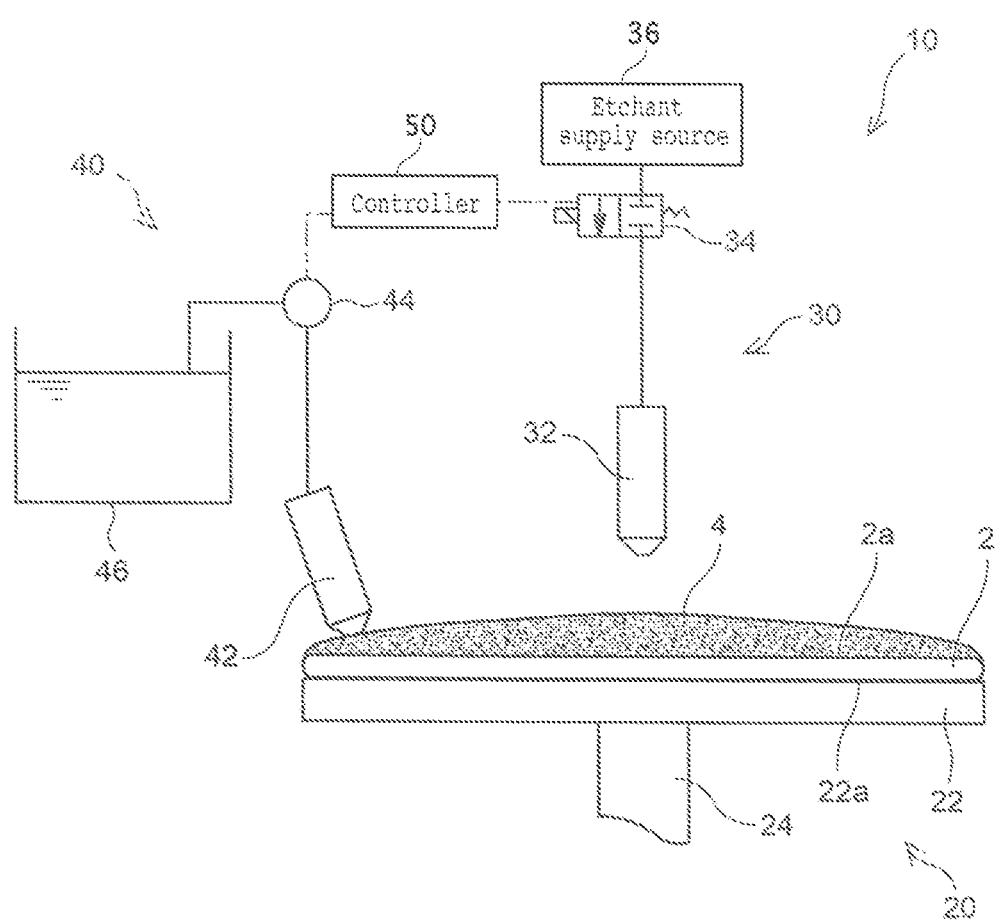
FIG. 4 is a diagram illustrating an etchant removal step in the wet etching method of the first embodiment performed by the first configuration example of FIG. 1.
Figure 5:
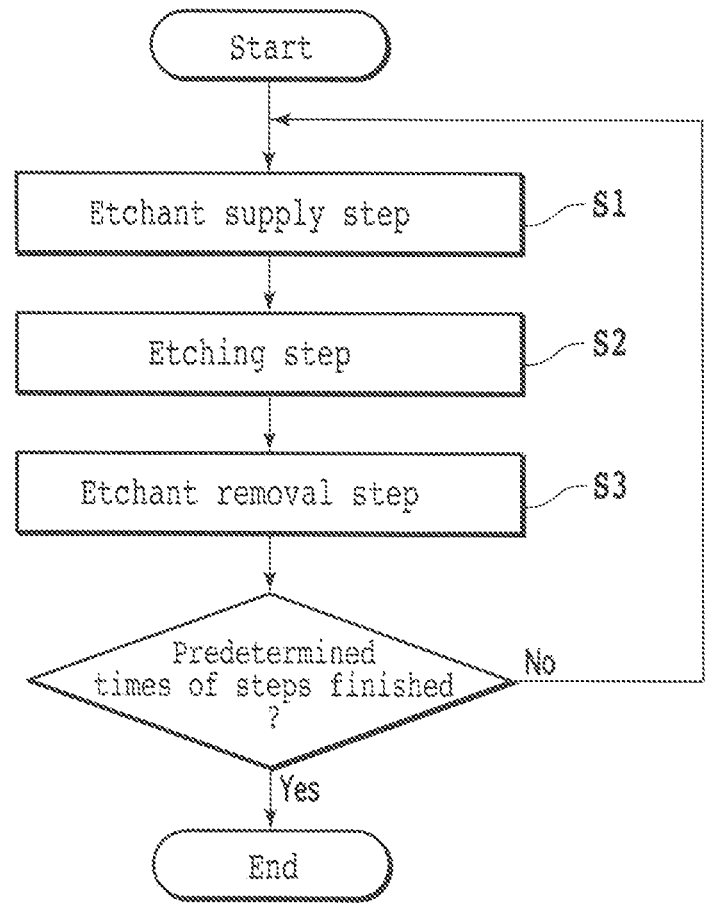
FIG. 5 is a flow chart of the wet etching method of the first embodiment.

Referring to FIGS. 2 to 5, a description will next be made regarding an example in which etching is performed by the above-described system configuration. FIG. 2 is a diagram illustrating an etchant supply step in a wet etching method of the first embodiment performed by the first configuration example of FIG. 1. FIG. 3 is a diagram illustrating an etching step in the wet etching method of the first embodiment performed by the first configuration example of FIG. 1. FIG. 4 is a diagram illustrating an etchant removal step in the wet etching method of the first embodiment performed by the first configuration example of FIG. 1. FIG. 5 is a flow chart of the wet etching method of the first embodiment. The following individual steps are performed in the order indicated in the flow chart of FIG. 5.

<Etchant Supply Step S1>

As illustrated in FIG. 2, the etchant 4 is supplied from the etchant supply nozzle 32 to the to-be-etched surface 2a of the workpiece 2. Described specifically, after an elapse of a predetermined time since opening of the etchant supply valve 34, the controller 50 closes the etchant supply valve 34, whereby a predetermined amount of the etchant 4 is supplied from the etchant supply nozzle 32 to the to-be-etched surface 2a of the workpiece 2.

The amount of the etchant 4 to be supplied may preferably be set so that the etchant 4 does not drip from an outer peripheral edge of the to-be-etched surface 2a, whereby wasteful use of the etchant 4 can be avoided.

<Etching Step S2>

As illustrated in FIG. 3, the to-be-etched surface 2a is etched with the etchant 4 remaining on the to-be-etched surface 2a under surface tension. This etching step is performed for a predetermined time. Described specifically, assuming that a closing timing of the etchant supply valve 34 is an etching start time, the controller 50 counts a time from the etching start time, and after an elapse of a predetermined time, allows the etching processing to proceed to the etchant removal step.

<Etchant Removal Step S3>

As illustrated in FIG. 4, the etchant 4 remaining on the resulting etched surface 2a is removed from the etched surface 2a. Described specifically, the controller 50 drives the pump 44 for a predetermined time, so that the etchant 4 is sucked through the etchant suction nozzle 42 and is delivered to the collection tank 46.

As illustrated in FIG. 5, the above-mentioned etchant supply step S1, etching step S2, and etchant removal step S3 are sequentially performed. Further, these steps S1 to S3 are repeated a predetermined plural number of times. It is to be noted that no particular limitation is imposed on the number of times of repetitions of the steps S1 to S3. Depending on the kind of the etchant 4 and that of the material to be etched on the side of the workpiece 2, steps S1 to S3 may be performed only once.

If steps S1 to S3 are repeated, etching is performed with an unused fresh supply of the etchant 4 in each cycle of the etching step S2, so that a high etch rate (in other words, etch speed; volume of workpiece etched per unit time) can be realized.

Moreover, the used etchant 4 still remaining on the resulting etched surface 2a is removed in the etchant removal step S3. In the etching step S2, etching is therefore performed with only an unused fresh supply of the etchant 4, thereby enabling to realize a high etch rate.

Instead of sucking the etchant 4 through the etchant suction nozzle 42 as mentioned above, the etchant 4 may be removed from the etched surface 2a by using, for example, a spinner table, which can be rotated at a high speed by a motor, as the holding table 22 so that the etchant 4 is spun off from the etched surface 2a under a centrifugal force (spinning removal). If this is the case, it is preferred to dispose a wall that covers surroundings of the holding table 22, and also to collect the spun-off etchant 4.

In this case, the holding subsystem 20 can also be provided with the function of the etchant removal subsystem 40, thereby enabling to omit the etchant suction nozzle 42, the pump 44, and the collection tank 46. If the holding table 22 is rotated at a high speed, the etchant 4 scatters around, so that a wall or the like is arranged enclosing the surroundings of the holding table 22. It may also be configured so that the suction through the etchant suction nozzle 42 and the rotation of the holding table 22 are both performed.

Figure 6:
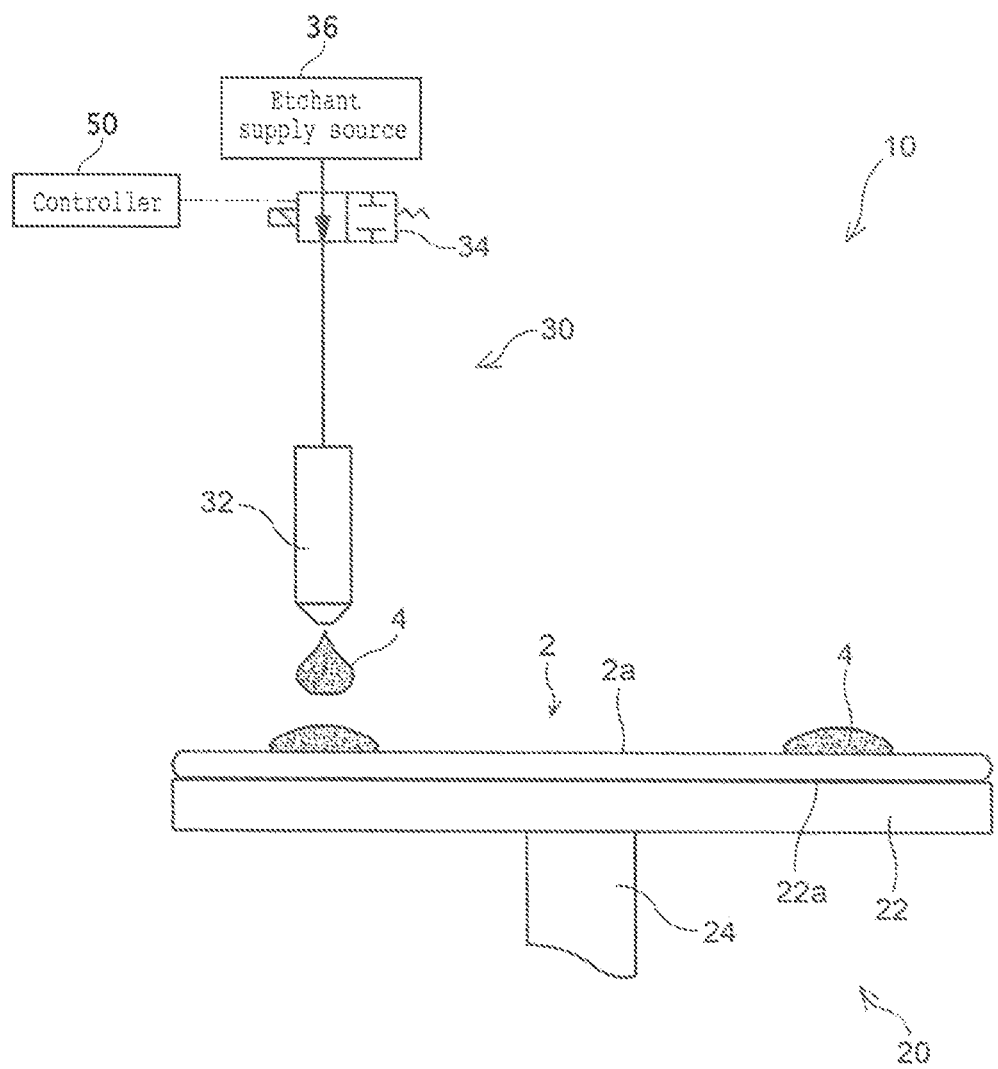
FIG. 6 is similar to FIG. 3, but is a diagram illustrating an example in which etching is performed locally.

In addition, as illustrated in FIG. 3, the etchant 4 may be supplied to the entire surface of the upper side of the workpiece 2 to etch the entirety of the to-be-etched surface 2a. As an alternative, as illustrated in FIG. 6 which is similar to FIG. 3 but is a diagram illustrating an example in which etching is performed locally, the etchant 4 may be supplied to only particular locations of the workpiece 2, the particular locations requiring etching, so that etching is performed locally.

Second Embodiment

Figure 7:
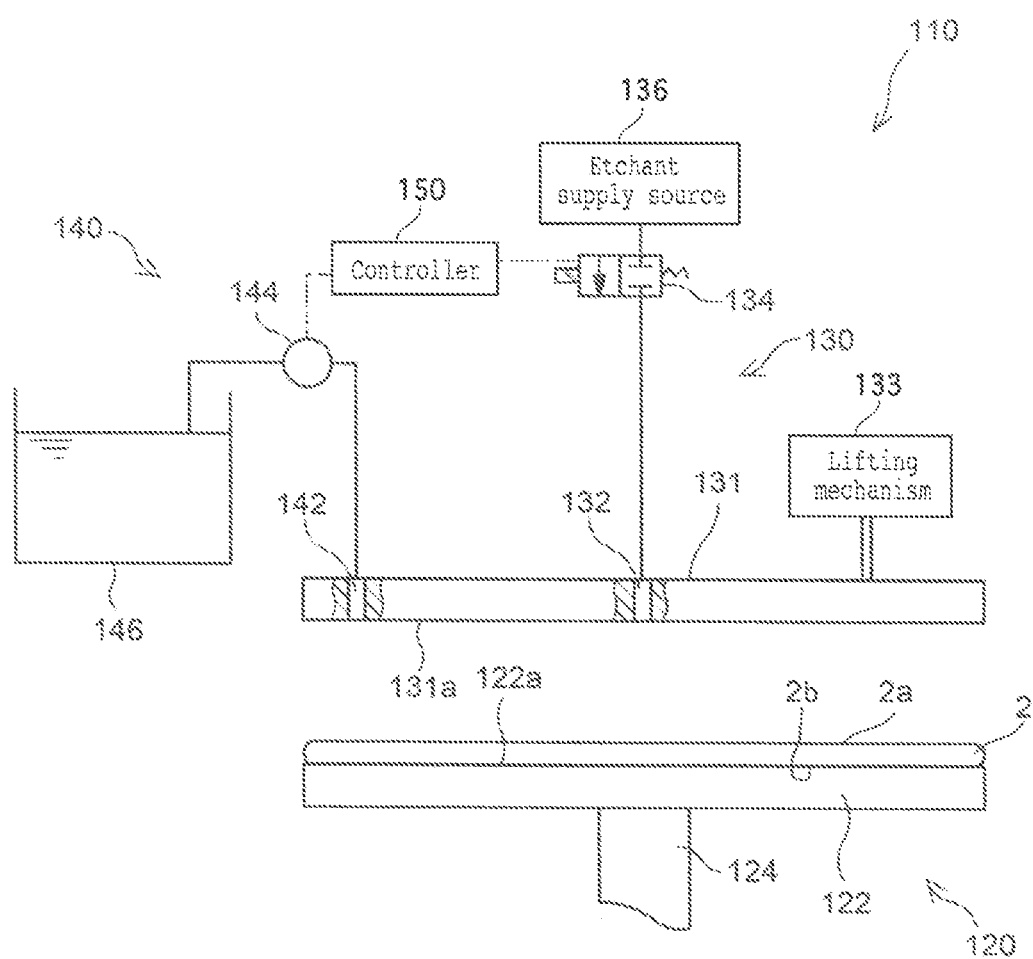
FIG. 7 a diagram illustrating a second configuration example of the wet etching system.
Figure 8:
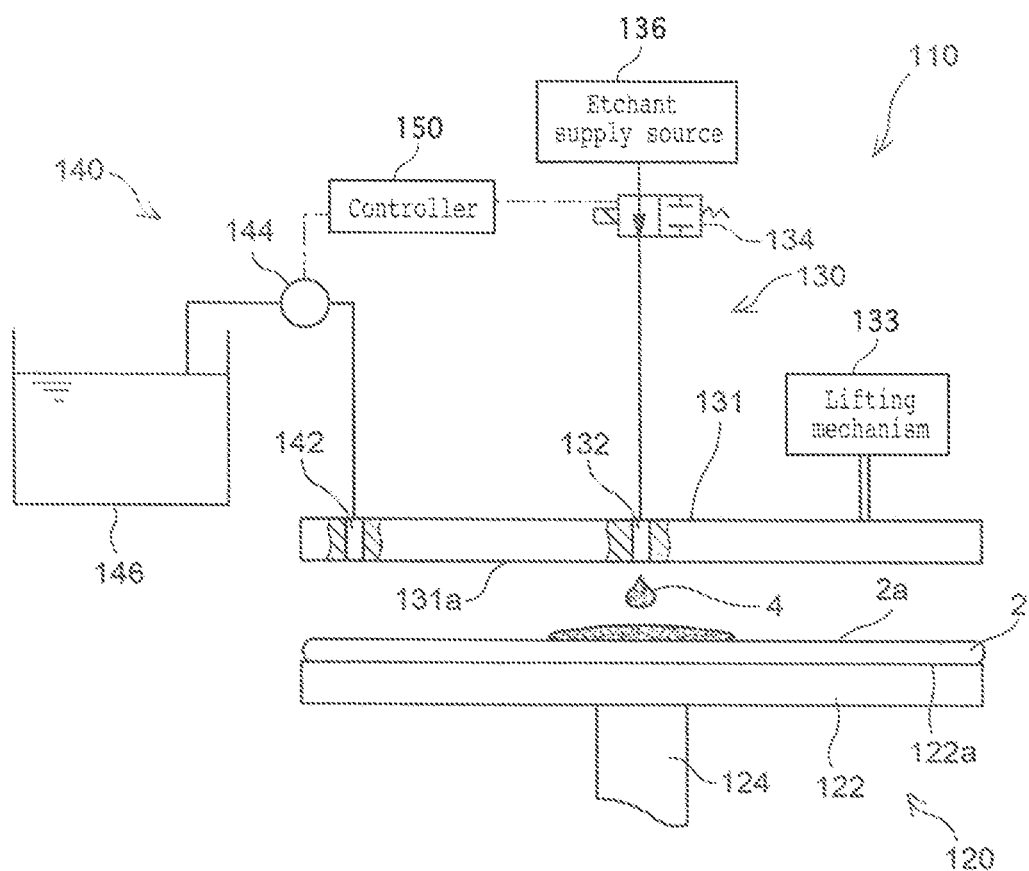
FIG. 8 is a diagram illustrating an etchant supply step in a wet etching method of a second embodiment performed by the second configuration example of FIG. 7.

FIG. 7 is a diagram illustrating a second configuration example of the wet etching system, and FIG. 8 is a diagram illustrating an etchant supply step in a wet etching method of a second embodiment performed by the second configuration example of FIG. 7. With reference to FIGS. 7 and 8, a description will be made regarding a wet etching system 110 according to the second configuration example. The configurations of individual constituents are merely illustrative and are not intended to specifically limit the scope of the present invention, and equivalent constituents and configurations can be adopted.

As illustrated in FIGS. 7 and 8, the wet etching system 110 includes a holding subsystem 120 that holds a workpiece 2 such as a silicon wafer, an etchant supply subsystem 130 that supplies an etchant 4 to a to-be-etched surface 2a of the workpiece 2, an etchant removal subsystem 140 that removes the etchant 4 from the resulting etched surface 2a, and a controller 150 that is configured to control these subsystems 130 and 140.

The holding subsystem 120 includes a holding table 122 having a holding surface 122a that holds the to-be-held surface 2b as a lower side of the workpiece 2, and a support base 124 that supports the holding table 122, and is configured similar to the holding subsystem 20 in the first configuration example.

The etchant supply subsystem 130 includes a pressing member 131 that has an etchant supply nozzle 132 for supplying the etchant 4 to the to-be-etched surface 2a of the workpiece 2, an etchant supply valve 134, and an etchant supply source 136 that is connected to the etchant supply nozzle 132 via the etchant supply valve 134. The pressing member 131 is formed of a plate-shaped member, includes a pressing surface 131a opposing the holding surface 122a of the holding table 122, and is moved up and down by a lifting mechanism 133 constructed of an electric actuator or the like.

Through a central portion of the pressing member 131, the etchant supply nozzle 132 is disposed so as to be directed toward the holding surface 122a of the holding table 122, and the etchant 4 is supplied from the etchant supply nozzle 132 to the to-be-etched surface 2a of the workpiece 2. No particular limitation is imposed on the specific form of the etchant supply nozzle 132. For example, the etchant supply nozzle 132 can be configured of a bore that opens in the pressing surface 131a of the pressing member 131.

The on/off of the etchant supply valve 134 is controlled by the controller 150, whereby a predetermined amount of the etchant 4 is supplied onto the to-be-etched surface 2a of the workpiece 2.

The pressing surface 131a of the pressing member 131 has an area equal to or greater than that of the to-be-etched surface 2a, and is configured to press and spread out the etchant 4 supplied onto the to-be-etched surface 2a so that the etchant 4 can be spread over the entirety of the to-be-etched surface 2a. The amount of the etchant 4 to be supplied is set so that the etchant 4 spreads over the entirety of the to-be-etched surface 2a. Owing to the spreading-out of the etchant 4 by the pressing surface 131a as described above, the etchant 4 can be supplied over the entirety of the to-be-etched surface 2a in a short time even if the workpiece 2 has a large diameter.

Figure 9:
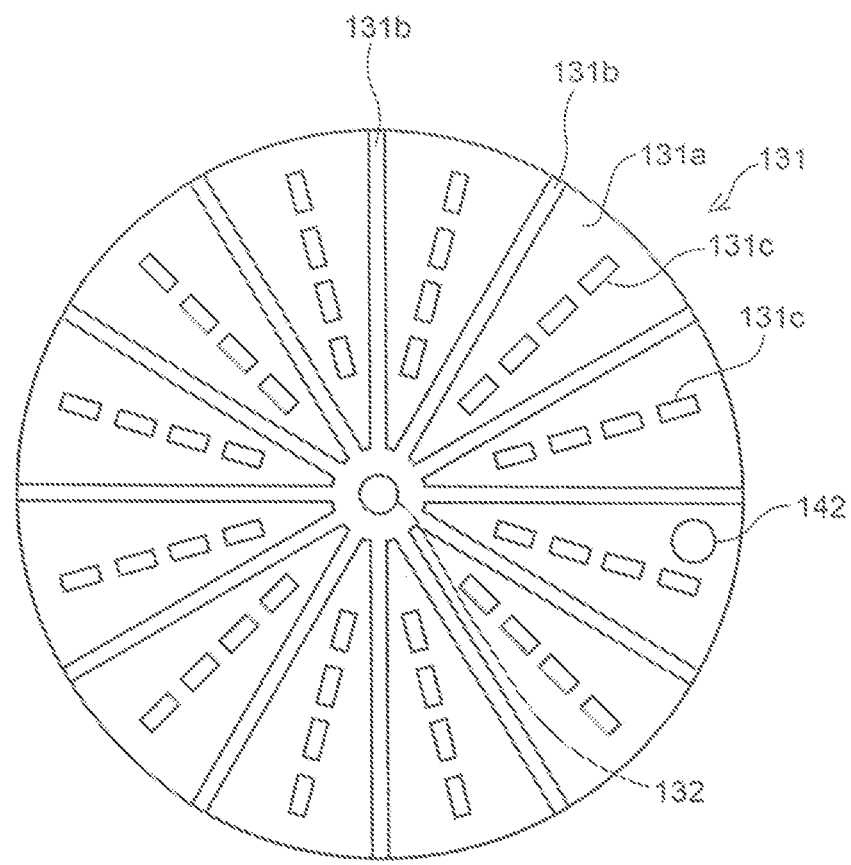
FIG. 9 is a diagram illustrating a configuration example of a pressing member in the second configuration example of FIG. 7.
Figure 10:
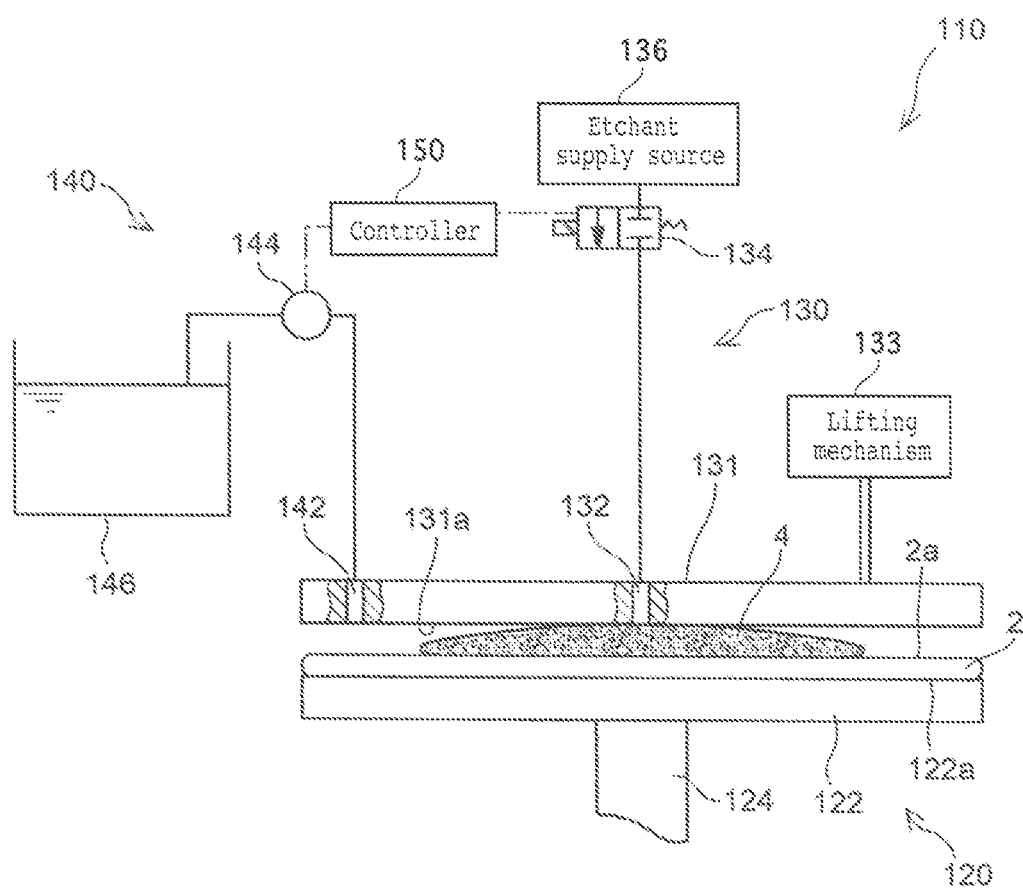
FIG. 10 is a diagram illustrating a pressing step in the wet etching method of the second embodiment performed by the second configuration example of FIG. 7.
Figure 11:
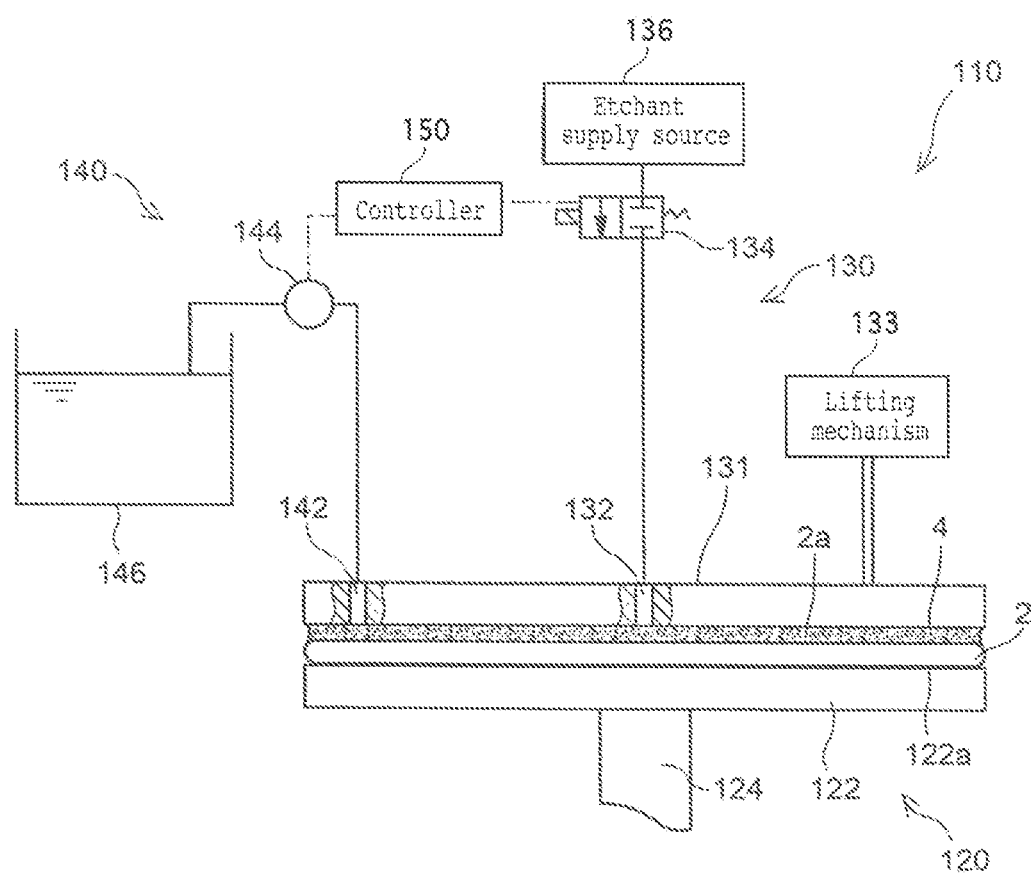
FIG. 11 is a diagram illustrating an etching step in the wet etching method of the second embodiment performed by the second configuration example of FIG. 7.

Reference is now made to FIG. 9, which is a diagram illustrating a configuration example of the pressing member 131 in the second configuration example of FIG. 7. As illustrated in FIG. 9, in the pressing surface 131a of the pressing member 131, a plurality of grooves 131b is formed extending radially from a position of the etchant supply nozzle 132. According to this configuration, the etchant 4 is allowed to flow through the grooves 131b, and as illustrated in FIGS. 10 and 11, the etchant 4 can hence be spread out over the entirety of the to-be-etched surface 2a in a shorter time. This configuration is suited especially when the workpiece 2 has a large diameter. It is to be noted that the etchant supply nozzle 132 and the etchant suction nozzle 142 are also illustrated in FIG. 9.

Further, the pressing member 131 illustrated in FIG. 8 may be configured to be rotatable. This configuration can spread the etchant 4 while swirling it in a peripheral direction. In addition, an arrangement of protruding portions 131c on the pressing surface 131a of the pressing member 131 as illustrated in FIG. 9 can stir the etchant 4 so that the etch rate (in other words, etch speed; volume of workpiece etched per unit time) can be improved.

As illustrated in FIGS. 7 and 8, the etchant removal subsystem 140 includes an etchant suction nozzle 142 that sucks and removes the etchant 4 remaining on the resulting etched surface 2a of the workpiece 2, a pump 144 that produces a suction force in the etchant suction nozzle 142, and a collection tank 146 that collects the etchant 4 sucked through the etchant suction nozzle 142.

At a position remote from the central portion of the pressing member 131, the etchant suction nozzle 142 is disposed so as to be directed toward the holding surface 122a of the holding table 122. Instead of disposing the single etchant suction nozzle 142 at the one location, a plurality of etchant suction nozzles 142 may be disposed at a like plurality of locations, respectively. No particular limitation should be imposed on the specific form of the etchant suction nozzle 142. Instead of configuring the etchant suction nozzles 142 by the bore opening in the pressing surface 131a of the pressing member 131 as in the present embodiment, the etchant suction nozzle 142 can also be configured as a discrete element from the pressing member 131.

By driving the pump 144 through the controller 150 and producing a suction force in the etchant suction nozzle 142, the etchant 4 is sucked and collected in the collection tank 146.

Figure 12:
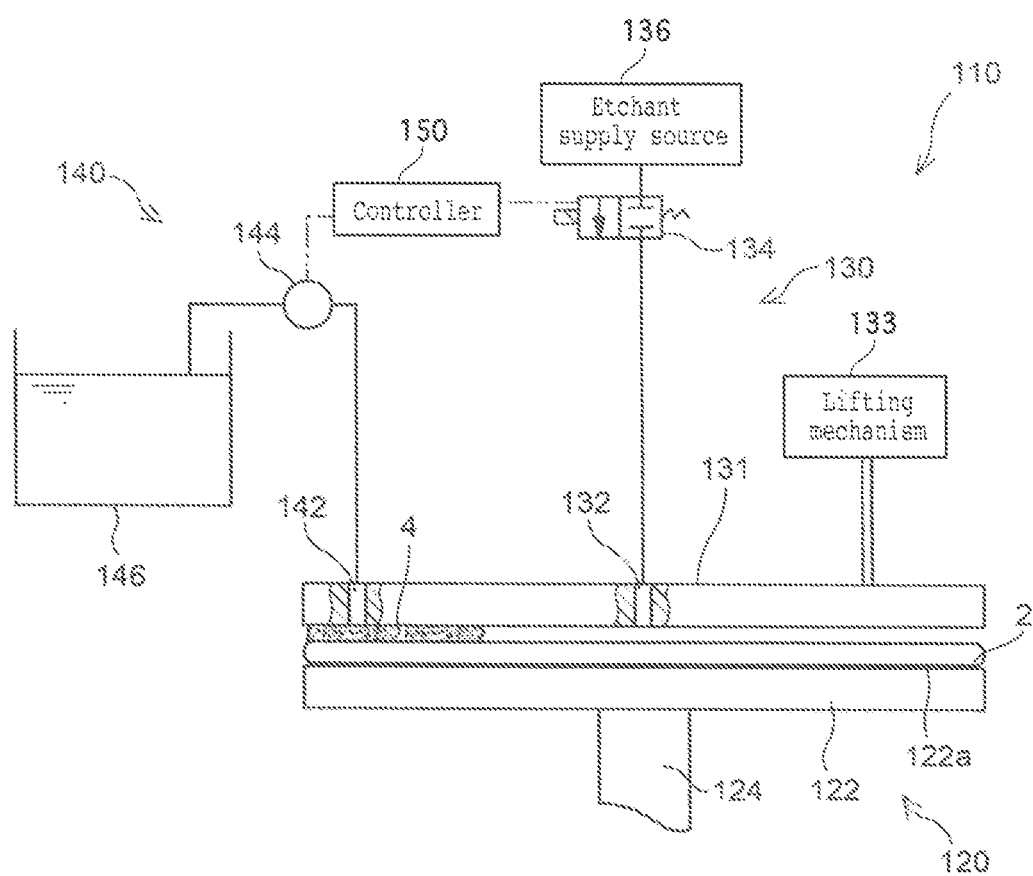
FIG. 12 is a diagram illustrating an etchant removal step in the wet etching method of the second embodiment performed by the second configuration example of FIG. 7.
Figure 13:
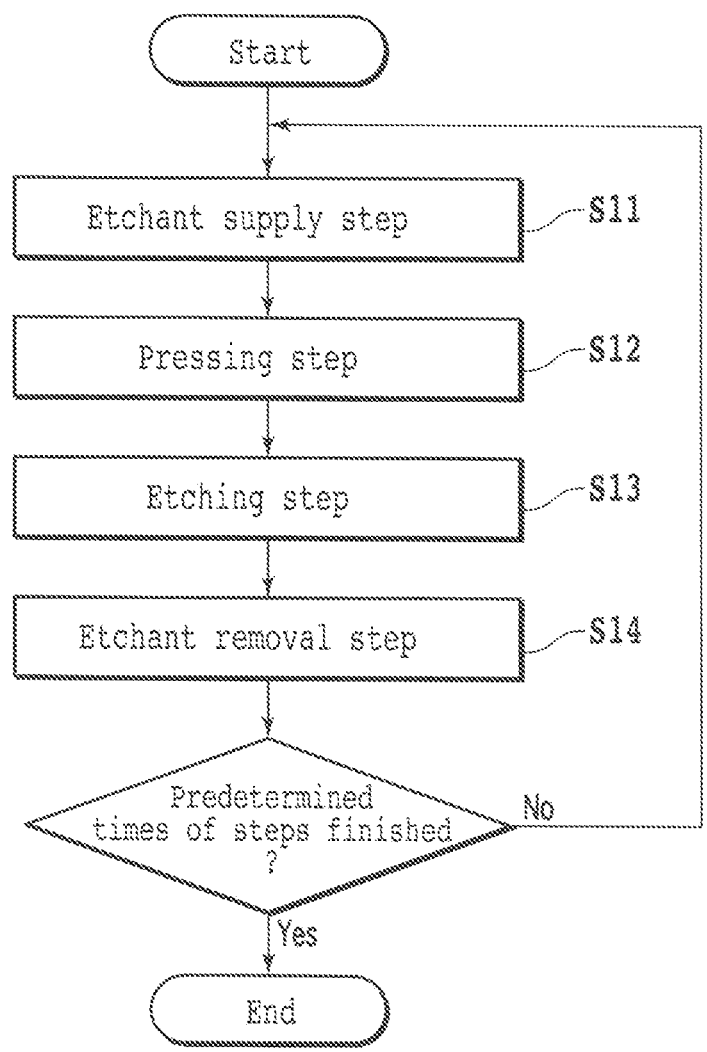
FIG. 13 is a flow chart of the wet etching method of the second embodiment.

Referring to FIGS. 10 to 13, a description will next be made regarding an example in which etching is performed by the above-described system configuration. FIG. 10 is a diagram illustrating a pressing step in the wet etching method of the second embodiment performed by the second configuration example of FIG. 7. FIG. 11 is a diagram illustrating an etching step in the wet etching method of the second embodiment performed by the second configuration example of FIG. 7. FIG. 12 is a diagram illustrating an etchant removal step in the wet etching method of the second embodiment performed by the second configuration example of FIG. 7. FIG. 13 is a flow chart of the wet etching method of the second embodiment. The following individual steps are performed in the order indicated in the flow chart of FIG. 13.

<Etchant Supply Step S11>

As illustrated in FIG. 8, the etchant 4 is supplied from the etchant supply nozzle 132 to the to-be-etched surface 2a of the workpiece 2. Described specifically, after an elapse of a predetermined time since opening of the etchant supply valve 134, the controller 150 closes the etchant supply valve 134, whereby a predetermined amount of the etchant 4 is supplied from the etchant supply nozzle 132 to the to-be-etched surface 2a of the workpiece 2.

The amount of the etchant 4 to be supplied may preferably be set so that the etchant 4 does not drip from an outer peripheral edge of the to-be-etched surface 2a, whereby wasteful use of the etchant 4 can be avoided.

<Pressing Step S12>

As illustrated in FIG. 10, the etchant 4 which exists on the to-be-etched surface 2a of the workpiece 2 is pressed and spread out by the pressing member 131. Described specifically, the controller 150 drives the lifting mechanism 133 to move the pressing surface 131a of the pressing member 131 closer toward the holding table 122, so that a space between the pressing surface 131a and the to-be-etched surface 2a is filled with the etchant 4 to spread the etchant 4 over the entirety of the to-be-etched surface 2a.

<Etching Step S13>

As illustrated in FIG. 11, the to-be-etched surface 2a is etched with the etchant 4 spread over the entirety of the to-be-etched surface 2a. This etching step is performed for a predetermined time. Described specifically, assuming that a finishing timing of the pressing step is an etching start time, the controller 150 counts a time from the etching start time, and after an elapse of a predetermined time, allows the etching processing to proceed to the etchant removal step.

In this etching step, the pressing member 131 may be rotated. Further, this etching step S13 may be performed concurrently with the pressing step S12.

<Etchant Removal Step S14>

As illustrated in FIG. 12, the etchant 4 remaining on the resulting etched surface 2a is removed from the etched surface 2a. Described specifically, the controller 150 drives the pump 144 for a predetermined time, so that the etchant 4 is sucked through the etchant suction nozzle 142 and is delivered to the collection tank 146.

After the suction of the etchant 4 has been finished, the controller 150 drives the lifting mechanism 133 so that the pressing surface 131a of the pressing member 131 is moved away from the holding table 122.

As illustrated in FIG. 13, the above-mentioned etchant supply step S11, pressing step S12, etching step S13, and etchant removal step S14 are performed in this order. Further, these steps S11 to S14 are repeated a predetermined number of times. It is to be noted that no particular limitation is imposed on the number of times of repetitions of the steps S11 to S14. Depending on the kind of the etchant 4 and that of the material to be etched on the side of the workpiece 2, steps S11 to S14 may be performed only once.

Instead of sucking the etchant 4 through the etchant suction nozzle 142 as mentioned above, the etchant 4 may be removed from the etched surface 2a by using, for example, a spinner table, which can be rotated at a high speed by a motor, as the holding table 122 so that the etchant 4 is spun off from the etched surface 2a under a centrifugal force (spinning removal). If this is the case, it is preferred to dispose a wall that covers surroundings the holding table 122, and also to collect the spun-off etchant 4.

In this case, the holding subsystem 120 can also be provided with the function of the etchant removal subsystem 140, thereby enabling to omit the etchant suction nozzle 142, the pump 144, and the collection tank 146. If the holding table 122 is rotated at a high speed, the etchant 4 scatters around so that a wall or the like is arranged enclosing the surroundings of the holding table 122. It may also be configured so that the suction through the etchant suction nozzle 142 and the rotation of the holding table 122 are both performed.

The present invention can be realized as described above. Described specifically, as illustrated in FIGS. 1 to 5, there is provided the wet etching method including the etchant supply step S1 of supplying the etchant 4 from the etchant supply nozzle 32 to the to-be-etched surface 2a of the workpiece 2, then etching step S2 of etching the to-beetched surface 2a with the etchant 4 remaining on the to-be-etched surface 2a, and the etchant removal step S3 of, after performing the etching step S2, removing the etchant 4, which still remains on the resulting etched surface 2a, from the etched surface 2a. The etchant supply step S1, the etching step S2, and the etchant removal step S3 are repeated a plurality of times in this order.

According to the wet etching method described above, etching can be performed with the etchant 4 remaining on the to-be-etched surface 2a so that the amount of the etchant 4 to be used can be reduced compared with the existing wet etching. In addition, etching is performed with an unused fresh supply of the etchant 4 after removal of the etchant 4, which has reacted with the workpiece 2, from the etched surface 2a of the workpiece 2 under etching. It is therefore possible to ensure a high etch rate (in other words, etch speed; volume of workpiece etched per unit time) and also to reduce etching time.

As illustrated in FIGS. 8 to 11, there is also provided the above-described wet etching method, which further includes, after performing the etchant supply step S1, the pressing step S12 of pressing the etchant 4, which has been supplied to the to-be-etched surface 2a of the workpiece 2, by the pressing member 131 that includes the pressing surface 131a having the area equal to or greater than the area of the to-be-etched surface 2a of the workpiece 2 and etching resistance. In the etching step S13, the to-be-etched surface 2a is etched with the etchant 4 remaining between the pressing surface 131a of the pressing member 131 and the to-be-etched surface 2a of the workpiece 2.

According to this wet etching method, even if the workpiece 2 has a large diameter and the to-be-etched surface 2a has a large area, for example, the etchant 4 can be supplied over the entirety of the to-be-etched surface 2a in a short time, thereby enabling to reduce the etching time.

As illustrated in FIGS. 1 through 4, there is also provided the wet etching system 10 including the holding subsystem 20 that holds the workpiece 2 with the to-be-etched surface 2a of the workpiece 2 exposed, the etchant supply subsystem 30 that supplies the etchant 4 to the to-be-etched surface 2a of the workpiece 2 held by the holding subsystem 20, the etchant removal subsystem 40 that removes the etchant 4 from the resulting etched surface 2a of the workpiece 2, and the controller 50 that controls the etchant supply subsystem 30 and the etchant removal subsystem 40. The controller 50 is configured to control the etchant supply subsystem 30 and the etchant removal subsystem 40 so that, after the etchant 4 is supplied from the etchant supply subsystem 30 to the to-be-etched surface 2a of the workpiece 2 held on the holding subsystem 20, the to-be-etched surface 2a is etched with the etchant 4 remaining on the to-be-etched surface 2a, and the etchant 4 on the etched surface 2a is then removed from the etched surface 2a by the etchant removal subsystem 40, and the supply of the etchant 4, the etching of the to-be-etched surface 2a, and the removal of the etchant 4 from the etched surface 2a are repeated a plurality of times in this order.

According to the above-described wet etching system 10, etching can be repeated a plurality of times, under automatic control by the controller 50.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wet etching method comprising:
   providing a pressing member having an enchant supply nozzle and an enchant suction nozzle;
   an etchant supply step of supplying an etchant from the etchant supply nozzle in the pressing member to a to-be-etched surface of a workpiece;
   a pressing step of pressing the etchant supplied to the to-be-etched surface of the workpiece, by the pressing member that includes a pressing surface having an area equal to or greater than an area of the to-be-etched surface of the workpiece and etching resistance;
   an etching step of etching the to-be-etched surface with the etchant remaining on the to-be-etched surface; and
   an etchant removal step of, after performing the etching step, sucking and removing the etchant still remaining on the resulting etched surface using the etchant suction nozzle on the pressing member, from the etched surface, wherein said etchant suction nozzle is independent of and spaced from the etchant supply nozzle,
   wherein the etchant supply step, the pressing step, the etching step, and the etchant removal step are repeated a plurality of times in this order.

2. The wet etching method according to claim 1, further comprising storing the etchant removed from the etched surface in a collection tank.

3. The wet etching method according to claim 1, wherein the etchant supply step includes supplying unused etchant from the etchant supply nozzle to the to-be-etched surface of the workpiece.

4. The wet etching method according to claim 1, wherein the pressing step supplying the etchant to the to-be-etched surface of the workpiece through grooves formed in the pressing surface of the pressing member.

* * * * *

UNITED STATES PATENT AND TRADEMARK OFFICE
CERTIFICATE OF CORRECTION

PATENT NO. : 12,119,230 B2  
APPLICATION NO. : 17/220990  
DATED : October 15, 2024  
INVENTOR(S) : Sekiya et al.

Page 1 of 1

It is certified that error appears in the above-identified patent and that said Letters Patent is hereby corrected as shown below:

In the Claims

Column 10, Line 18, Claim 1, delete "enchant" and insert --etchant-- therefor.

Column 10, Line 19, Claim 1, delete "enchant" and insert --etchant-- therefor.

Signed and Sealed this  
Tenth Day of December, 2024

Katherine Kelly Vidal  
*Director of the United States Patent and Trademark Office*